United States Patent [19]

Strandberg

[11] Patent Number: 5,010,307
[45] Date of Patent: Apr. 23, 1991

[54] OSCILLATOR HAVING PERIODICALLY PULSED CRYSTAL

[75] Inventor: Hans G. Strandberg, Sundbyberg, Sweden

[73] Assignee: Siemens Aktiengesellschaft, Munich, Fed. Rep. of Germany

[21] Appl. No.: 467,180

[22] Filed: Jan. 19, 1990

[30] Foreign Application Priority Data

Jan. 20, 1989 [EP] European Pat. Off. ........ 89100970.6

[51] Int. Cl.$^5$ .............................................. H03B 5/36
[52] U.S. Cl. ............................. 331/116 FE; 331/166; 331/158
[58] Field of Search ............ 331/116 R, 116 FE, 158, 331/165, 166, DIG. 3, 128, 173, 174

[56] References Cited

U.S. PATENT DOCUMENTS

| 4,117,421 | 9/1978 | Wiesner | 331/116 R |
| 4,743,789 | 5/1988 | Puskas | 310/316 |

FOREIGN PATENT DOCUMENTS

OS2603543 8/1977 Fed. Rep. of Germany .
2005944 4/1979 United Kingdom .

OTHER PUBLICATIONS

"A One-Pin Crystal Oscillator for VLSI Circuits", Santos, et al., IEEE Journal of Solid-State Circuits, vol. SC-19, Apr. 1984 (pp. 228-235).

Primary Examiner—Siegfried H. Grimm
Attorney, Agent, or Firm—Hill, Van Santen, Steadman & Simpson

[57] ABSTRACT

An oscillator circuit for use with a supply line and a line at a reference potential includes a crystal and a switching stage, the switching stage being closeable to connect the crystal to the supply line via one terminal of the crystal. The other terminal of the crystal is connected to the line at reference potential. Closing of the switching stage is controlled by a drive unit, which has an input to which the output of the switching stage is fed back. The drive circuit causes the switching stage to be briefly closed during a half period of the oscillation. If the oscillator circuit is manufactured as an integrated circuit, only one terminal pin is required for connection to the crystal, thereby saving space.

10 Claims, 3 Drawing Sheets

OSCILLATOR HAVING PERIODICALLY PULSED CRYSTAL

BACKGROUND OF THE INVENTION

1. Field of the Invention

The present invention is directed to an oscillator circuit for generating an output signal which executes a periodic oscillation, the oscillator circuit being of the type connectible to a crystal via terminals.

2. Description of the Prior Art

Many oscillator circuits are known which make use of an electrical energized crystal as the oscillator source. Many of these known circuits include means for compensating for the slight energy losses which occur during the mechanical oscillation of the crystal.

In these known circuits, usually the electrical signal corresponding to the mechanical oscillation of the crystal is tapped and re-supplied to the crystal via an amplifier circuit, which gives the signal a suitable phase shift. This is known as a linear solution to the energy loss problem because the oscillation of the quartz is maintained by supplying energy at a suitable phase relationship to the oscillation of the crystal. Although the necessary energy is thereby supplied to the crystal, a damping of the oscillation occurs due to phase errors and due to the low output impedance of the amplifier. This is compensated by a correspondingly increased energy supply. These known oscillator circuits therefore have a low efficiency, and are less suitable for applications wherein a low power consumption is a critical criterion, as is the case, for example, in implantable medical devices such as heart pacemakers and the like.

A further disadvantage of most known oscillator circuits is that these circuits must include two separate terminal pins for the crystal, if constructed as integrated circuits. Each terminal pin increases the space requirement for the integrated circuit, and it is therefore desireable to have an oscillator circuit wherein only one specific terminal pin is required for connection to the crystal. Such a circuit is described in the article "A One-Pin Crystal Oscillator for VLSI Circuits," Santos et al., IEEE Journal of Solid State Circuits, Vol. SC-19, No. 2, April 1984, pages 228-235. In this known circuit, however, there is the risk that the oscillator circuit will not oscillate with the fundamental frequency of the crystal, but instead with a harmonic, which is undesirable.

SUMMARY OF THE INVENTION

It is an object of the present invention to provide an oscillator circuit which has a high efficiency and which has only one specific terminal pin for connection of the circuit to the crystal.

The above object is achieved in accordance with the principles of the present invention in an oscillator circuit for use with at least one supply line and a line at a reference potential. The oscillator circuit includes a switching stage and a drive circuit. The crystal has one terminal connectible to the output of the switching stage, and its other terminal is connectible to the line a reference potential. The drive circuit has an input connected to the output of the switching stage and operates the switching stage so that the supply line, when the switching stage is closed, is briefly connected to the crystal to energize the crystal. The oscillator circuit may be used with two supply lines, respectively at voltages of opposite polarity, in which case the switching stage will consist of two switch elements, each controlled by the drive circuit so that during the positive half-period of the oscillation the crystal is briefly connected to the positive voltage supply line, and during the negative half-period of the oscillation, the crystal is briefly connected to the negative voltage supply line.

In the oscillator circuit disclosed herein, therefore, energy supplied to the crystal does not take place continuously, but instead occurs only briefly during a half-period of the oscillation. The result is that the switching stage places substantially no load on the crystal. Although the switching unit has a slight output impedance in its driven (closed) condition, this occurs only briefly. In contrast to known circuits wherein the low output impedance of the amplifier circuit has a damping effect during the entire half-period, a significantly increased efficiency is achieved in the oscillator circuit disclosed herein. Phase problems are also eliminated because the energy supply does not take place continuously, but instead occurs pulse-like, as long as the switching stage connects the crystal to the supply line have the polarity corresponding to the half-period of the oscillation of the crystal. Because the crystal has a terminal connected to a line at reference potential, for example ground, only one specific terminal pin is required in the oscillator circuit for connection to the crystal, if the oscillator circuit is constructed as an integrated circuit. The risk that the crystal will not oscillate at its fundamental oscillation, but would instead be excited to oscillate at one of its harmonics, is avoided because the crystal oscillates in an entirely free manner, except for the brief moment of energy delivery.

An extremely high functional reliability of the circuit is achieved if the drive circuit operates the switching unit during successive half-periods of the oscillation. It is also possible, however, for the drive circuit to close the switching unit only during identical half-periods of the oscillation, i.e., every other half-period.

In a further embodiment of the invention, one of the supply lines may be the line at reference potential. This is particularly useful, for example, if a unipolar supply is used, such as a battery.

In a preferred embodiment of the invention, the drive circuit includes a delay circuit to which the output signal of the switching stage is supplied so that, in addition to the original drive signal, a delayed drive signal is also supplied to the switching stage. The signals required for operating the switching unit can be generated in an especially simple manner using this embodiment. Because the frequencies at which typical crystals oscillate are usually in the kilohertz region, it is sufficient to drive the switching stage for a duration on the order of magnitude of microseconds. The delay circuit in the drive circuit can be formed by a plurality of series-connected logic gates.

In a further embodiment of the invention, the drive circuit includes an input stage which converts the output signal from the switching stage into a square wave signal having a duty factor which is dependent on the level of the output signal. In this embodiment, the point in time at which the drive of the switch unit occurs, giving a dropping level of the output signal, is shifted from the beginning of a half-period to a later point in time within the half-period. Because, however, the pulsed energy delivery is more effective the closer it is to the amplitude maximum of the half-period (the energy delivery being most effective at the amplitude peak), load-dependent level fluctuations of the switching stage output signal are automatically compensated.

In a further embodiment of the invention, the switch stage consists of a series circuit of four semiconductor switches connected between the supply lines. The junction of the two middle semiconductor switches forms the output of the switching stage. One of the two semiconductor switches situated between the output of the switching unit and the supply line is driven with the undelayed drive signal, and the other semiconductor switch is driven with the delayed drive signal. In this embodiment, energy delivery occurs during successive half-periods of the oscillation. An especially simple structure of the circuit, which facilities the construction thereof as an integrated circuit, is achieved in an embodiment wherein the drive circuit has an input stage consisting of an invertor and a delay circuit consisting of an uneven plurality of invertors connected in series. This embodiment can be used when the switching stage acts to invert the incoming signal. If the switching unit acts in a non-inverting fashion, the drive circuit may include either a buffer, or a series circuit of two invertors as the input stage.

DESCRIPTION OF THE PREFERRED EMBODIMENTS

Figure 1:
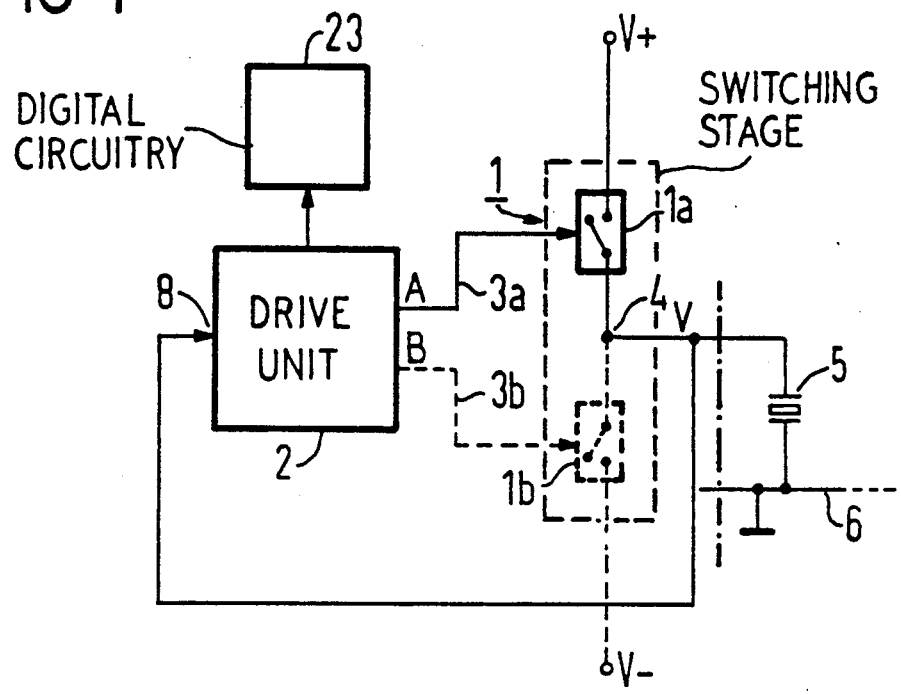
FIG. 1 is a schematic block diagram of an oscillator circuit constructed in accordance with the principles of the present invention.

An oscillator circuit constructed in accordance with the principles of the present invention is schematically shown in FIG. 1. The oscillator circuit includes a switching stage 1, consisting of two switches 1a and 1b, each actuateable by a drive circuit 2. The switches 1a and 1b are constructed so that they close when a control signal is supplied thereto from the drive circuit 2, via respective lines 3a and 3b. The switches 1a and 1b are connected in series between two supply lines referenced V+ and V−, which are in turn connected to a power supply (not shown). The junction 4 of the two switches 1a and 1b forms the output of the switching stage 1. As shown in FIG. 1, a crystal 5 has one terminal connected to the output 4 of the switching stage 1, and the other terminal of the crystal 5 is connected to a line 6 which is at reference potential. In the embodiment of FIG. 1, the line 6 is at ground. The output signal of the switching stage is supplied from the junction 4 to an input 8 of the drive circuit 2. The drive circuit 2 controls the switching stage 1 on the basis of the output signal supplied to the drive unit 2, such that the output 4 of the switching stage 1 is briefly connected to either the supply line V+ or V−. Operation of the switching stage 1 is such that the supply line having the voltage which is the same polarity as the respective half-period of the oscillation will be connected to the junction 4, and thus to the crystal 5. Therefore the crystal 5 will be briefly connected to the supply line having the positive voltage during the positive half-periods of the oscillation, and will be connected to the supply line having the negative voltage during the negative half-periods of the oscillation.

A signal suitable for control of digital circuits generally referenced at 23 is taken from the drive circuit 2 at a location suitable for this purpose, for example following a buffer stage.

Figure 2:
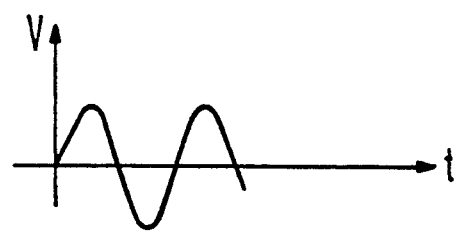
FIGS. 2, 3 and 4 show signals occurring at various points in the circuit of FIG. 1.
Figure 3:
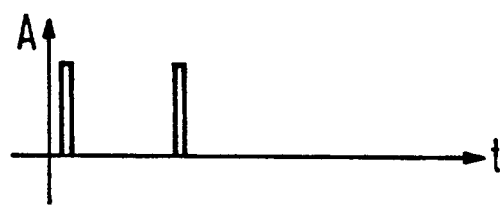
Figure 4:
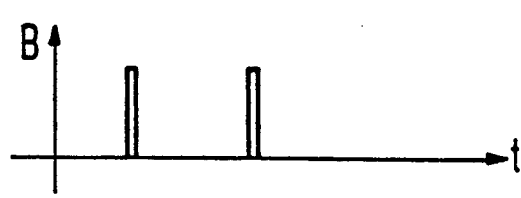

FIG. 2 shows the signal V at the junction 4 in FIG. 1. FIG. 3 shows the signal A on the line 3a in FIG. 1, and FIG. 4 shows the signal B on the line 3b in FIG. 1, the signals A and B being shown in FIGS. 3 and 4 in the correct chronologically relationship to one another. The drive circuit 2 thus generates a brief pulse on the line 3a during each positive half-period of the oscillating output signal, and generates a brief pulse via the line 3b during each negative half-period of the oscillating output signal. Each of these pulses closes the corresponding switch 1a or 1b during its pulse duration, so that energy delivery to the crystal 5 occurs during this time span. The energy delivery thus takes place during successive and different half-periods of the oscillation.

As indicated by the dashed line illustration of the switch 1b, the line 3b and the supply line V−, these components can be eliminated. In this case, the aforementioned power supply (not shown) is connected to the supply line V+, and to the line 6 at reference potential. In this case, energy delivery takes place only during identical half-periods of the oscillation, i.e., during each positive half-period of the oscillation, which constitutes every other half-period of the oscillation which constitutes every other half-period of the oscillation. Further in this case, the drive unit 2 includes a voltage adapting network which corrects the voltage level at the input 8.

If the input 8 of drive circuit 2 has a sufficient input impedance, the crystal 5 is not loaded by the drive circuit 2 to a significant degree. The switching stage 1 similarly does not significantly load the crystal 5, even though it has a low output impedance in its driven condition, because it is driven only briefly during a half-period. Phase shifts cannot occur in the oscillator circuit shown in FIG. 1 as long as it is assured that the output at the junction 4 of the driven switching stage 1 is connected to the supply line having a polarity which corresponds to the current half-period of the oscillation.

During the time when the switching stage 1 is not driven, the crystal 5 executes a free oscillation, so that the risk that the crystal will not oscillate at its fundamental frequency, but instead at a harmonic of the fundamental frequency, is extremely low.

Figure 5:
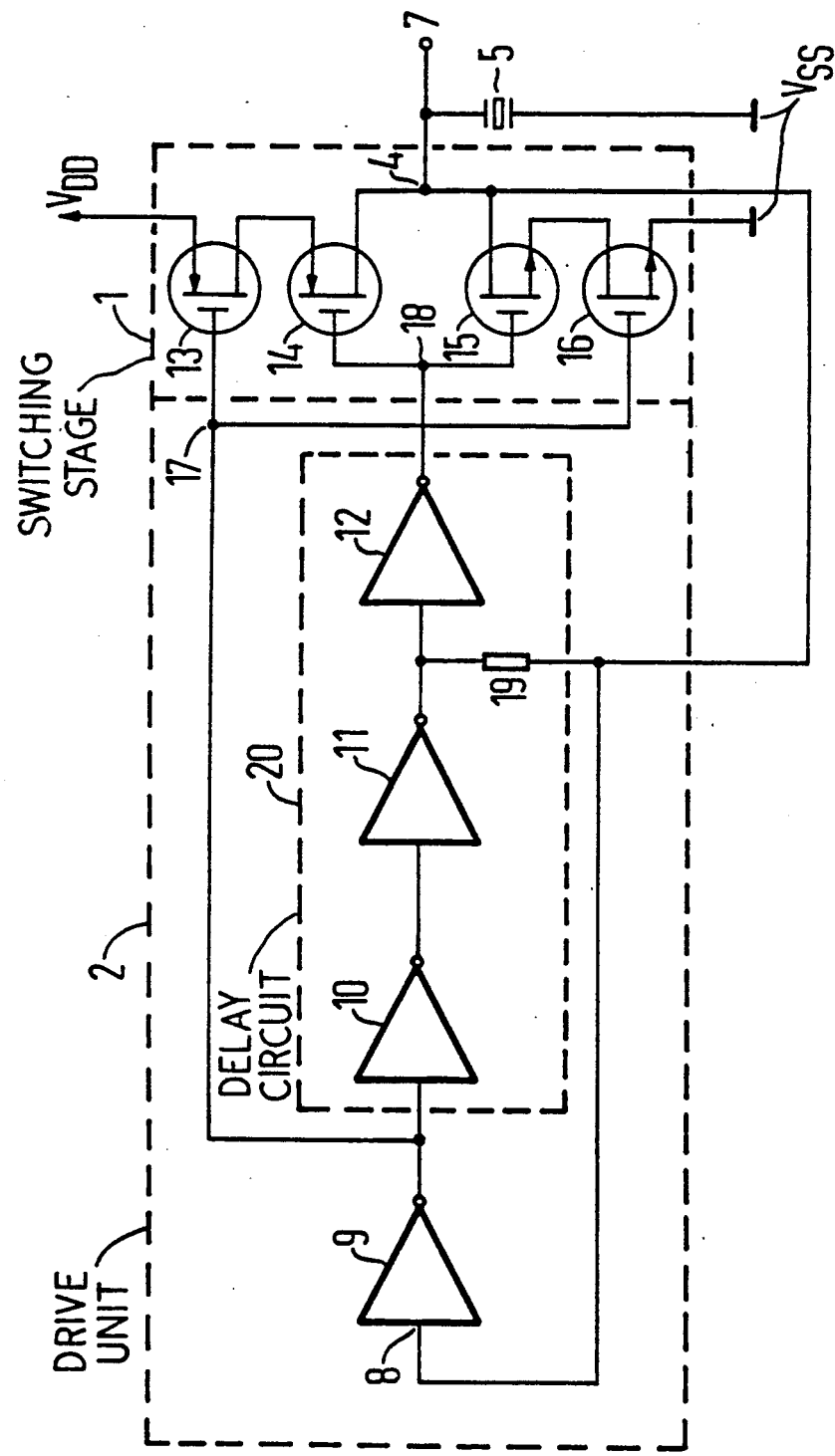
FIG. 5 is a circuit diagram of an embodiment of the oscillator circuit of FIG. 1 constructed using standard logic components.

An oscillator circuit is shown in FIG. 5 wherein the drive circuit is formed by four invertors 9, 10, 11 and 12 connected in series. The switching stage 1 consists of a series circuit of four MOS field effect transistors 13, 14, 15 and 16, functioning as semiconductor switches. The field effect transistors 13 and 14 are of the p-channel type, and the field effect transistors 15 and 16 are of the n-channel type. The respective sources of the field effect transistors 13 and 16 are connected to supply lines $V_{DD}$ and $V_{SS}$, which may be connected to the poles of a unipolar power supply (not shown). The respective gate terminals of the field effect transistors 13 and 16 are connected to each other at a node 17, and the respective gates of the field effect transistors 14 and 15 are connected to each other at a node 18. The node 17 is connected to the output of the invertor 9, and the node 18 is connected to the output of the invertor 12. The junction of the respective drains of the transistors 14 and 15 forms the output 4 of the switching stage 1, which is connected to the input of the drive circuit 2, i.e., to the input of the invertor 9. A high-impedance resistor 19 is connected between the output 4 of the switching stage 1 and the input of the invertor 12. The resistor 19 sets the voltage level at the output 7 and at the input 8, such that square wave signals at the outputs of each of the invertors 9, 10, 11 and 12 have substantially the same duty factor.

The crystal 5 has one terminal connected to the output of the switching stage 1, and another terminal connected to the supply $V_{SS}$, the supply line $V_{SS}$ also functioning as the line al reference potential.

The circuit of FIG. 5 operates as follows. The output signal of the switching stage 1 is supplied to the invertor 9, which represents the input stage of the drive circuit 2. The sinusoidal output signal is converted by the invertor 9 into a square-wave signal having an amplitude which changes between the levels of a logical one and a logical zero, and is inverted. This signal is supplied to the node 17, and thus to the gate terminals of the transistors 13 and 16. This signal also passes through the invertors 10, 11 and 12, as a result of which it is slightly delayed, and inverted. The invertors 10, and 12 thus constitute a delay circuit, generally referenced 20, having an output corresponding to the output from the invertor 9, but slightly delayed and inverted. This signal is supplied to the node 18, and thus to the gate terminals of the transistors 14 and 15. During each positive half-period of the output signal, the nodes 17 and 18 simultaneously briefly (for the duration of the delay time) are at the potential of logical zero, and during each negative half-period the nodes 17 and 18 simultaneously briefly are at the potential of logical one. This results in the field effect transistors 13 and 14 being simultaneously briefly open during each positive half-period of the output signal, and the field effect transistors 15 and 16 are briefly simultaneously open during each negative half-period of the output signal. The crystal 5 thus receives a pulse-like energy delivery with the proper polarity during each half-period of its oscillation.

Because the invertor 9 does not change its output state until the output signals supplied to it upwardly or downwardly transgress a defined threshold, the time at which the switching stage is driven during a half-period is dependent on the level of the output signal. As noted earlier, the pulse-like energy delivery is most efficient when it coincides with the amplitude peak of the output signal during a half-period. Any decrease in the level of the oscillating output signal will be automatically compensated in the circuit of FIG. 5, because during the half-period of the oscillation, the energy delivery will occur at a slightly later time, closer to the amplitude maximum, and thus closer to the most efficient time.

Figure 6:
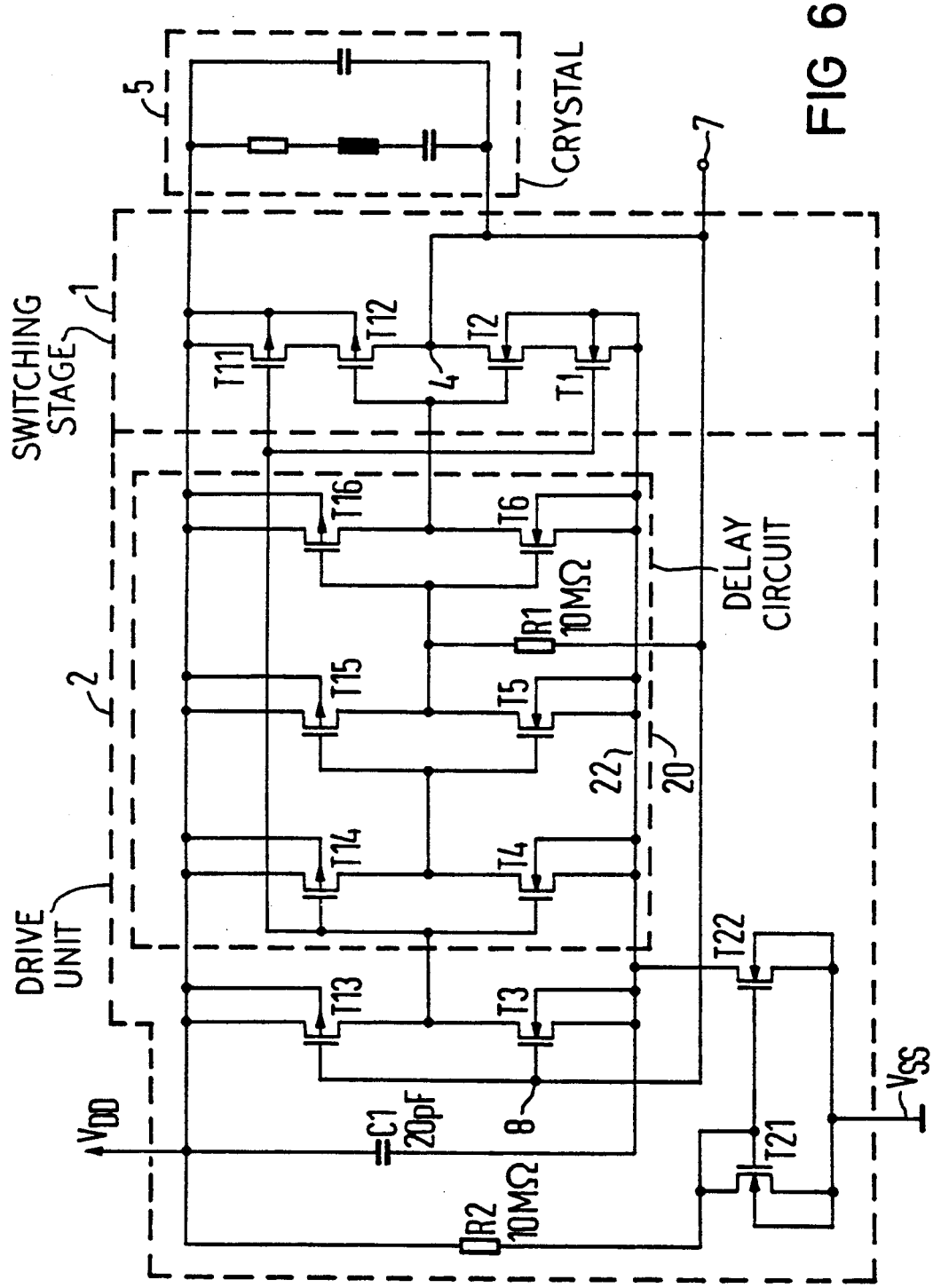
FIG. 6 is a circuit diagram of the oscillator circuit of FIG. 1 manufactured as an integrated circuit.

The circuit shown in FIG. 6 generally corresponds to the circuit of FIG. 5, with the supply line $V_{DD}$ functioning as the line at reference potential. In FIG. 6, the crystal 5, instead of being designated with the conventional circuit symbol for a crystal, is shown in terms of its equivalent circuit, consisting of an RCL series circuit with a parallel capacitance. The crystal 5 has one terminal connected to the output 4 of the switching stage 1, and has its other terminal connected to the supply line $V_{DD}$.

The circuit of FIG. 6 includes a drive circuit 2 which is again in the form of a series circuit of four invertors. The individual invertors are each formed by a complementary pair of MOS field effect transistors in a known manner. The invertors are thus respectively formed by the transistor pairs T3 and T13, T4 and T14, T5 and T15, and T6 and T16. The invertor formed by the transistors T3 and T13 represents the input stage of the drive circuit 2, and corresponds to the invertor 9 of FIG. 5. The other transistor pairs respectively correspond to the invertors 10, 11 and 12 of FIG. 5, and represent the delay circuit 20 of the drive circuit 2. The switching stage 1 is formed by four MOS field effect transistors T1, T2, T11 and T12, connected essentially in the same manner as described in connection with FIG. 5. In FIG. 6, the input 8 of the drive circuit 2 is again connected to the output 4 of the switching stage 1, and a high-impedance resistor R1 is provided which corresponds to the resistor 19 shown in FIG. 5.

The sources of the transistors T3, T4, T5, T6 and T1 are not directly connected to the supply line $V_{SS}$, but are instead connected to a line 22. A current reflector circuit is formed by field effect transistors T21 and T22 and a high-impedance resistor R2. The current reflector circuit assures that the current flowing through the oscillator circuit from $V_{DD}$ to $V_{SS}$, which must flow through the transistor T22 connected between the line 22 and the supply line $V_{SS}$, does not exceed the current which flows through the resistor R2. This serves the purpose of reducing the power consumption of the circuit, but has the effect of causing a higher current to flow through the transistors T11 and T12, when driven, than flows through the transistors T1 and T2, when driven. To alleviate this situation, a capacitor C1 is connected as an energy storage component between the supply line $V_{DD}$ and line 22. This assures that sufficiently high pulse currents flow during the brief drive of the transistors T1 and T2.

All of the above embodiments have in common that the crystal 5 has one of its two terminals connected to a line at a reference potential. If the oscillator circuit is constructed as an integrated circuit, this means that only one specific terminal pin is required for the crystal 5. This represents a significant advantage since the volume requirement for an integrate circuit is largely dependent on the number of required terminal pins.

Although modifications and changes may be suggested by those skilled in the art, it is the intention of the inventor to embody within the patent warranted hereon all changes and modifications as reasonably and properly come within the scope of his contribution to the art.

I claim as my invention:

1. An oscillator circuit for use with a supply line at a voltage having a polarity and a line at reference potential, said oscillator circuit comprising:
  a crystal having a first terminal connected to said line at reference potential, and a second terminal;
  switch means having an output directly connected to said second terminal of said crystal, a control input, and being connected to said supply line for, when closed, connecting said supply line to said crystal to energize said crystal so that said crystal generates an output signal which executes a periodic oscillation; and
  drive means having an input connected to said output of said switch means and having an output connected to said control input of said switch means for closing said switch means for a fraction of a half-period of said periodic oscillation during those half-periods which have the same polarity as said supply line voltage.

2. An oscillator circuit as claimed in claim 1, for use with a further supply line at a voltage having a polarity opposite to the voltage of said supply line, wherein said switch means is connected to said further supply line for, when closed, connecting said further supply line to said crystal to energize said crystal, and wherein said drive means is a means for closing said switch means for a fraction of each half-period of said periodic oscillation so that said crystal is connected to that one of said supply line or said further supply line having the same polarity as said half-period of said periodic oscillation.

3. An oscillator circuit as claimed in claim 1, wherein said drive means is a means for closing said switch means during every other half-period of said periodic oscillation.

4. An oscillator circuit as claimed in claim 1, for use with a further supply line, said further supply line functioning as said line at reference potential.

5. An oscillator circuit as claimed in claim 1, wherein said drive means generates a drive signal at said drive means output, and wherein said drive means includes means for generating a delayed drive signal at a further output also connected to said switch means with the duration of the delay between said drive signal and said delayed drive signal defining the time during which said switch means is closed.

6. An oscillator circuit as claimed in claim 5, wherein said means for generating said delayed drive signal consists of a plurality of series-connected logic gates.

7. An oscillator circuit as claimed in claim 5, wherein said drive means includes an input stage means, preceding said means for generating a delayed drive signal, for converting said output signal from said crystal into a square wave having a duty factor dependent on the level of said output signal of said crystal.

8. An oscillator circuit as claimed in claim 5, wherein said switch means consists of first, second, third and fourth semiconductor switches each having a control electrode, said semiconductor switches being connected in series between said supply line and said line at reference potential, said second and third semiconductor switches being connected at a junction which forms said output of said switch means, and one of said first and second semiconductor switches and one of said third and fourth semiconductor switches being connected with their respective control electrodes to said output of said drive means and the other semiconductor switches being connected with their respective control electrodes to said further output of said drive means.

9. An oscillator circuit as claimed in claim 5, wherein said switch means has an inverting effect on said drive signal and said delayed drive signal, and wherein said drive means comprises an input stage, preceding said means for generating a delayed drive signal, formed by an invertor, and wherein said means for generating a delayed drive signal comprises an uneven number of series-connected invertors.

10. An oscillator circuit for use with two supply lines respectively at voltages of opposite polarity, and a line at a reference potential, said oscillator circuit comprising:
   a crystal having a first terminal connected to said line at reference potential, and a second terminal;
   a switching stage having an output directly connected to said second terminal of said crystal, and including a first switching element having a controlled path connected between one of said supply lines and said output of said switching stage, and having a control input, and a second switching element having a controlled path connected between the other of said supply lines and said output of said switching stage and having a control input, said switching elements, when closed, respectively connecting said crystal to one of said voltages so that said crystal generates an output signal which executes a periodic oscillation; and
   drive means having outputs respectively connected to said control inputs of said switching elements of said switching stage to alternatingly close one of said switching elements for a fraction of each half-period of said periodic oscillation so that said crystal is briefly connected to a voltage having the same polarity as the half-period of said periodic oscillation.

* * * * *